United States Patent [19]

Houkawa et al.

[11] 4,193,045

[45] Mar. 11, 1980

[54] TEMPERATURE COMPENSATED SURFACE ACOUSTIC WAVE OSCILLATORS

[75] Inventors: Kouji Houkawa, Kodaira; Yoshiki Yamauchi, Musashino; Shokichiro Yoshikawa, Mitaki, all of Japan

[73] Assignee: Nippon Telegraph and Telephone Public Corporation, Tokyo, Japan

[21] Appl. No.: 907,556

[22] Filed: May 19, 1978

[30] Foreign Application Priority Data

May 25, 1977 [JP] Japan .................................. 52-61575

[51] Int. Cl.$^2$ ............................................ H03B 5/32
[52] U.S. Cl. ................................ 331/107 A; 310/313; 310/315; 331/176; 333/155; 333/193
[58] Field of Search ..................... 331/107 A, 176; 333/30 R, 72, 155, 193; 310/313, 315

[56] References Cited

U.S. PATENT DOCUMENTS

| | | | |
|---|---|---|---|
| 3,821,666 | 6/1974 | Onoe et al. ............................ | 331/162 |
| 3,886,484 | 5/1975 | Dias et al. ......................... | 331/107 A |
| 3,889,205 | 6/1975 | Mitchell ...................... | 331/107 A X |

Primary Examiner—Siegfried H. Grimm

Attorney, Agent, or Firm—Frishauf, Holtz, Goodman & Woodward

[57] ABSTRACT

A plurality of parallel-connected surface acoustic wave (SAW) resonators, having different oscillation frequencies and different turnover temperatures, are connected to an active element containing circuit to form a SAW oscillator. The oscillator frequency deviation due to temperature is kept within a small allowable range $\Delta fa$ by satisfying the following formulas:

$$f_H - f_L \leq \Delta fa$$

$$T_{p1} < T_{p2} \ldots < T_{pn}$$

where
$f_H$: a maximum frequency among those frequencies of a plurality of SAW resonators connected to the active element-containing circuit which are produced at turnover temperatures on a temperature curve;

$f_L$: a minimum frequency among those of the plurality of SAW resonators; and $T_{p1}$ to $T_{p2}$: the turnover temperatures corresponding to the individual SAW resonators.

10 Claims, 19 Drawing Figures

TEMPERATURE COMPENSATED SURFACE ACOUSTIC WAVE OSCILLATORS

BACKGROUND OF THE INVENTION

This invention relates to a surface acoustic wave (SAW) oscillator comprising a plurality of parallel-connected surface acoustic wave resonators, each of which includes a pair of interdigitated electrodes mounted on a quartz substrate for propagating a surface acoustic wave.

Figure 1:
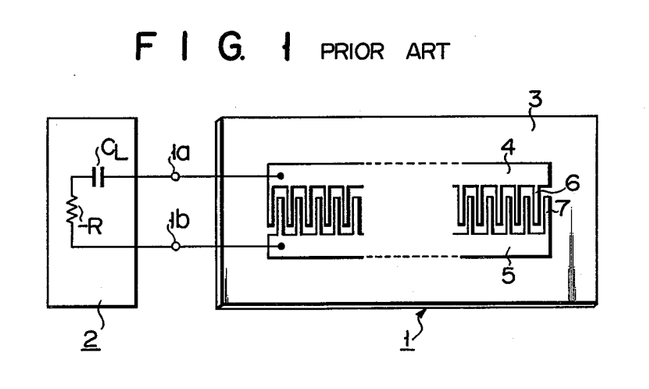
FIG. 1 schematically shows the arrangement of the prior art surface acoustic wave oscillator including a single surface acoustic wave resonator.

The prior art surface acoustic wave oscillator comprises as shown in FIG. 1, an active element-containing circuit 2 which is connected to a surface acoustic wave oscillator 1 through the terminals 1a, 1b. With the conventional surface acoustic wave oscillator 1, a pair of interdigitated electrodes 4, 5 (formed of electrode elements 6, 7 respectively) are mounted on the main plane of a substrate 3 prepared from, for example, quartz for connection to said active element-containing circuit 2.

Figure 2:
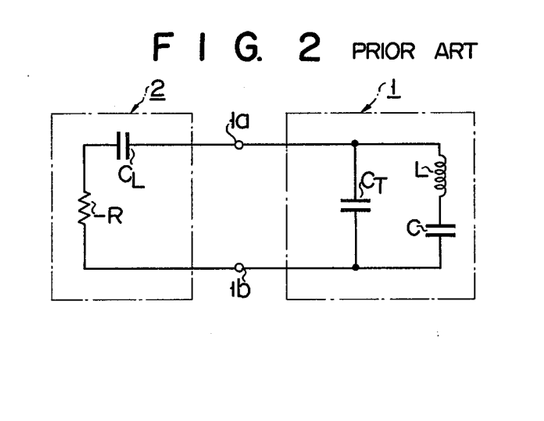
FIG. 2 is an equivalent circuit of the prior art surface acoustic wave oscillator of FIG. 1.

FIG. 2 shows an equivalent circuit of the surface acoustic wave oscillator of FIG. 1. According to this equivalent circuit, a resonator section 1 comprises a series circuit of an inductance L and capacitor C connected in parallel to another capacitor $C_T$. A circuit section 2 including an active element consists of a series circuit of a capacitor $C_L$ and negative resistor $-R$. The resonance circuit section 1 and circuit section 2 are connected by terminals 1a, 1b.

The constants L, C, $C_T$ of the equivalent circuit can be freely selected by changing the number of the respective paired electrode elements or fingers of the interdigital electrodes, the thickness of said interdigital electrodes and the length of those portions of the respective paired electrode elements or fingers which are actually interdigitated with each other.

Where the resonance circuit section 1 of a surface acoustic wave oscillator represented by the above-mentioned equivalent circuit has an impedance Z, then said oscillator is oscillated at a frequency f satisfying the condition expressed by the equation (1) below:

$$1/(j2\pi f C_L) + z = 0 \qquad (1)$$

where j is imaginary symbol.

Referring to a single resonator, the impedance z thereof generally varies with ambient temperature. This means that the surface acoustic wave oscillator has a frequency largely governed by ambient temperature.

Figure 3:
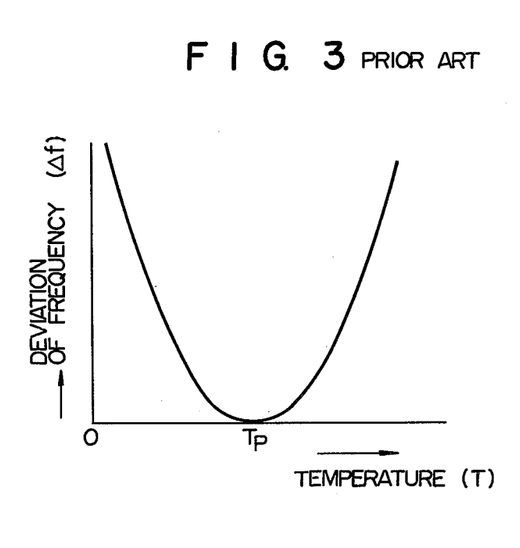
FIG. 3 is a curve diagram showing the frequency deviation of the prior art surface acoustic wave oscillator of FIG. 1 relative to embodiment temperature.

FIG. 3 is a curve diagram of the deviation $\Delta f$ of the aforesaid oscillation frequency f of the oscillator relative to ambient temperature T, where the substrate thereof is formed of quartz and the main plane of the quartz is represented by the rotated Y cut plane. As apparent from FIG. 3, the frequency deviation $\Delta f$ is substantially reduced to zero at the turnover temperature $T_p$. Where, however, the turnover temperature $T_p$ is shifted either upward or downward, then the frequency deviation $\Delta f$ increases along a second degree temperature coefficient. Compensation for the temperature dependency of oscillation frequency has hitherto been undertaken in a circuit including an active element. Yet said compensation has proved unsatisfactory.

A crystal oscillator which has been proposed to date to compensate for the temperature dependency of oscillation frequency includes the U.S. Pat. No. 3,821,666. According to this prior art, three bulk wave crystal vibrators are connected in parallel. This parallel circuit is connected to an active element-containing circuit. Said U.S. Patent oscillator is the temperature-compensation type which is intended to reduce frequency deviation over a prescribed temperature range by connecting in parallel the three crystal vibrators which collectively display a particular frequency deviation characteristic relative to ambient temperature.

The bulk vibrators included in a temperature compensation type oscillator present greater difficulties in manufacture, according as said oscillator is demanded to have a higher frequency. The reason is that a substrate of bulk wave crystal vibrator has to be made thinner in the inverse ratio to the increased frequency. Further, provision of, for example, wiring supports unavoidably give rise to variations in the properties of said temperature compensation type oscillator, whose practical application is therefore undesirably limited.

With a surface acoustic wave oscillator of this invention, the rotated Y cut plane of quartz is used as a substrate. A pair of interdigitated electrodes whose electrode elements are mounted on the main plane of the substrate in the alternately adjacent form are connected to an active-element containing circuit through connection terminals. According to the SAW resonator of this invention comprising a surface acoustic wave resonator presents a noticeable difference from the prior art bulk vibrator type oscillator in the properties resulting from the operation principle, construction and resonance condition, a plurality of surface acoustic wave resonators are connected in parallel and are so constructed that a prescribed relationship exists between the frequencies of the respective surface acoustic wave resonators as well as between the turnover temperatures. The technique of producing a surface acoustic wave oscillator embodying this invention has not been known to date, nor can be inferred from any prior art.

SUMMARY OF THE INVENTION

It is accordingly the object of this invention to provide a surface acoustic wave oscillator whose frequency varies little with ambient temperature.

To this end, the invention provides a surface acoustic wave oscillator which comprises a resonance circuit formed of a plurality of surface acoustic wave resonators having different oscillation frequencies and displaying different turnover temperatures on different curves denoting frequency deviations relative to ambient temperature, said each surface acoustic wave resonator being formed of a pair of interdigital electrodes whose electrode elements are mounted in the alternately adjacent form on a substrate for propagating a surface acoustic wave; and an active element-containing circuit connected to the resonance circuit, and wherein the plurality of surface acoustic wave resonators have such oscillation frequencies and turnover temperatures as meet the conditions expressed by the following formulas:

$$f_H - f_L \leq \Delta fa$$

$$T_{p1} < T_{p2} < \ldots T_{pn}$$

where:
$f_H$ = a maximum frequency among those frequencies of a plurality of resonators collectively connected to the active element-containing circuit which are produced at turnover temperatures on a temperature characteristic curve.

$f_L$ = a minimum frequency among said frequencies of the plurality of resonators.

$\Delta fa$ = allowable frequency deviation of the surface acoustic wave oscillator.

$T_{p1}$ to $T_{pn}$ = those turnover temperatures of the plurality of oscillators each comprising a single resonator which are indicated on a temperature characteristic curve.

This invention has newly developed the arrangement of the plurality of surface acoustic wave resonators mounted on the surface of a quartz substrate and the construction of electrodes constituting said resonators in order to meet the requirements denoted by the above formulas, thereby providing a surface acoustic wave oscillator whose frequency varies little with ambient temperature over a broad range.

This invention has the various prominent advantages that the SAW resonator used with the respective embodiments can be constructed by the technique of photolithography to admit of tonnage production; it is unnecessary to reduce the thickness of a substrate in inverse proportion to the resonance frequency as in the case of a bulk wave crystal vibrator, thereby ensuring the easy manufacture of the SAW oscillator with high precision in the frequency range from scores of Mega Hertz (MHz) units to several Giga Hertz (GHz) units; application of printed wiring on the same substrate enables the vibrating section and substrate to be separately supported, thereby eliminating variations in the properties of the SAW oscillator; and the constant of an equivalent circuit of the SAW oscillator can be freely selected by changing the number of the respective paired electrode elements or fingers of the interdigital electrodes and the width defined between said respective paired electrode element fingers, thereby enabling temperature compensation to be effected over a substantially unlimited range.

DETAILED DESCRIPTION

Figure 4:
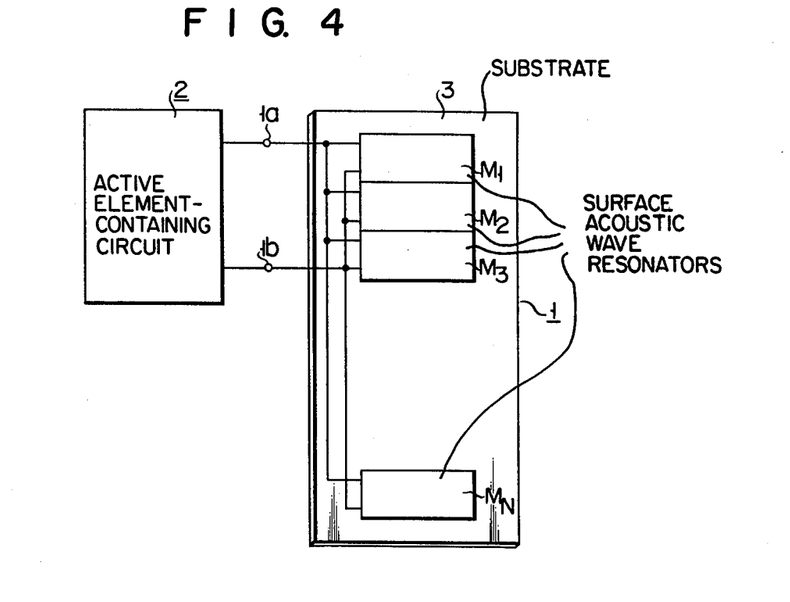
FIG. 4 schematically sets forth the arrangement of the surface acoustic wave oscillator of this invention comprising a plurality of parallel-connected surface acoustic wave resonators.

There will now be described by reference to the accompanying drawings a surface acoustic wave (SAW) oscillator embodying this invention. FIG. 4 schematically illustrates the principle by which the surface acoustic wave oscillator 1 of this invention is operated. A plurality of surface acoustic wave resonators $M_1$ to $M_n$ are connected in parallel on the main plane of a quartz substrate 3 prepared, for example, by the ST cut. This resonator section is connected to an active element-containing circuit 2 through terminals 1a, 1b. The arrangement of FIG. 4 is equivalently shown in FIG. 5. The respective surface acoustic wave resonators and active element-containing circuit 2 have the same arrangement as those of FIG. 2.

Figure 5:
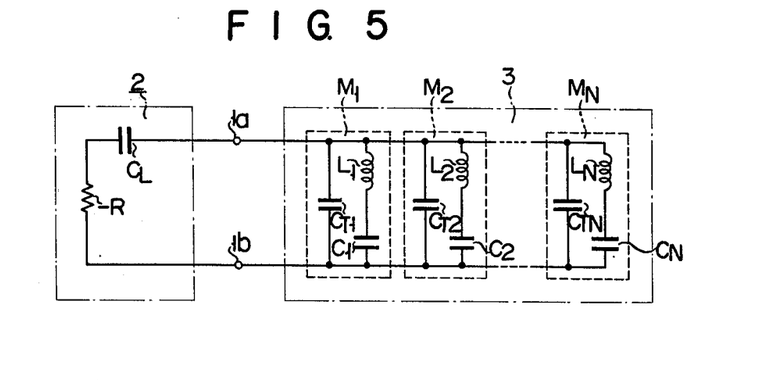
FIG. 5 is an equivalent circuit of the surface acoustic wave oscillator of FIG. 4.

The SAW resonator $M_1$ is indicated by a circuit formed by connecting a series circuit of an inductor $L_1$ and capacitor $C_1$ in parallel with another capacitor $C_{T1}$. The SAW resonator $M_i$ (i=1 to n) is represented by a circuit formed by connecting a series circuit of an inductor $L_i$ and capacitor $C_i$ in parallel with another capacitor $C_{Ti}$. (The suffix i denotes the serial positions of the actually used SAW resonator, inductor and capacitor respectively.) These circuits constituting the SAW resonators $M_1$, $M_i$ are connected to an active element-containing circuit through the connection terminals 1a, 1b.

The constants L, C, $C_T$ of the equivalent circuit can be freely selected by changing the number of the respective paired electrode elements or fingers of the interdigital electrodes, the thickness of said interdigital electrodes and the length of those portions of the respective paired electrode elements or fingers which are actually interdigitated with each other.

Assuming that the respective resonators $M_1$ to $M_n$ of FIG. 4 have impedances $Z_1$ to $Z_n$, then the surface acoustic oscillator 1 has an oscillation frequency f expressed as follows:

$$1/(j2\pi f C_L) + 1/(1/Z_1 + 1/Z_2 + \ldots 1/Z_N) = 0 \quad (2)$$

As seen from the above equation, the frequency of the surface acoustic wave oscillator 1 varies with the impedance of the parallel-connected resonators. If the impedance is governed by ambient temperatures, then the frequency f of said oscillator should also be affected by the ambient temperature. Now let it be assumed that the frequency of the surface acoustic wave oscillator of this invention is represented by $f_i$ (Hz); an intermediate temperature on a curve denoting the deviation of said frequency relative to ambient temperature T is indicated by $T_{pi}$; an allowable frequency deviation is denoted by $\Delta fa$. Then, the plural surface acoustic wave resonators $M_1$ to $M_n$ of the surface acoustic wave oscillator satisfy the conditions expressed by the following formulas:

$$f_H - f_L \leq \Delta fa \quad (3)$$

$$T_{p1} < T_{p2} < \ldots < T_{pN} \quad (4)$$

where:
$f_H$ = a maximum frequency among those frequencies of a plurality of resonators collectively connected to the active element-containing circuit which are produced at turnover temperatures on a temperature characteristic curve.
$f_L$ = a minimum frequency among said frequencies of the plurality of resonators.
$T_{p1}$ to $T_{pN}$ = peak temperatures on a curve denoting a frequency deviation relative to ambient temperature.

Figure 6:
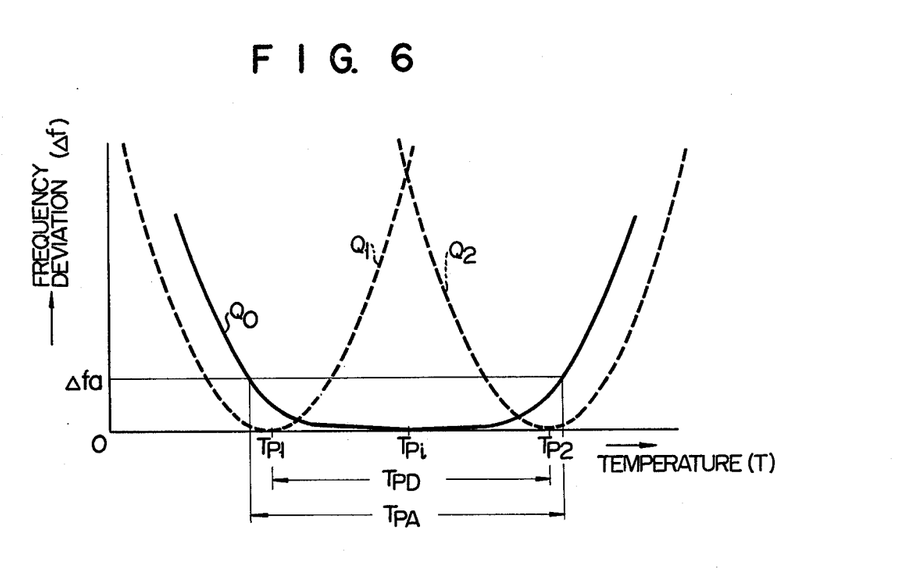
FIG. 6 is a curve diagram of the frequency deviation relative to ambient temperature of a surface acoustic wave oscillator according to one embodiment of this invention which is formed of two parallel-connected surface acoustic wave resonators.

Now let it be assumed that a surface acoustic wave oscillator comprises a resonator section formed of two resonators $M_1$, $M_2$ included in those ($M_1$ to $M_n$) shown in FIG. 4. Where the resonators $M_1$, $M_2$ are used separately, then the frequency deviation $\Delta f$ of said oscillator has such temperature dependency that as shown by the broken line curves $Q_1$, $Q_2$ of FIG. 6, the frequency deviation $\Delta f$ is reduced to zero only at turnover temperatures $T_{p1}$, $T_{p2}$. In contrast where the resonators $M_1$, $M_2$ are used in the parallel-connected form, then the frequency deviation $\Delta f$ approximates zero, as shown by the solid line curve $Q_0$ of FIG. 6, over a temperature range $T_{pD}$ extending between turnover temperatures $T_{p1}$ and $T_{p2}$ with an intermediate temperature $T_{pi}$ taken as the center. Further over a broader temperature range $T_{pA}$, the surface acoustic wave oscillator of this invention indicates a smaller frequency deviation than at least the allowable frequency deviation $\Delta fa$. The reason is that the parallel-connected surface acoustic waves resonators $M_1$, $M_2$ are considered to satisfy the condition of $f_2 - f_1 \leq \Delta fa$ derived from the aforesaid formula (3) and also the condition of $T_{p1} < T_{p2}$ resulting from the previously mentioned formula (4).

Figure 7:
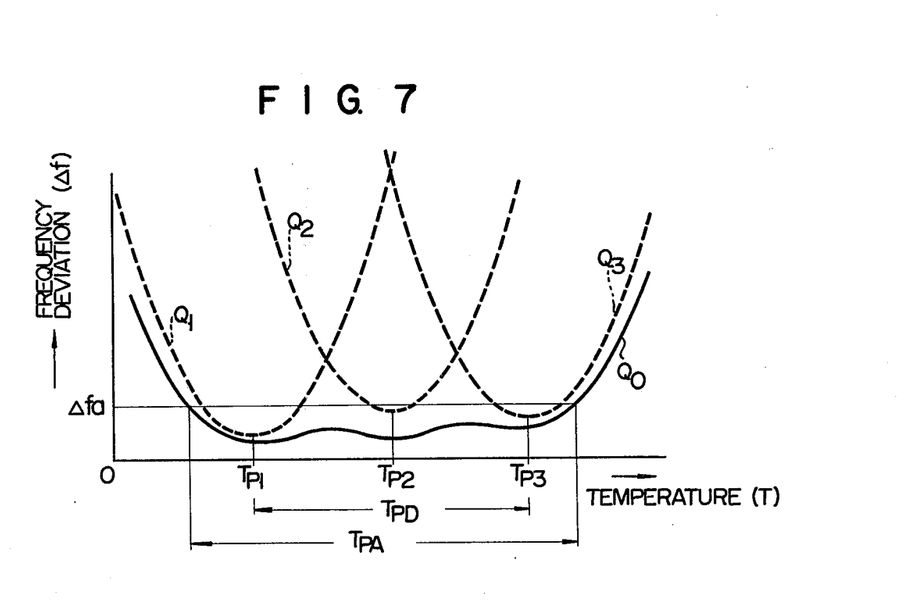
FIG. 7 is a curve diagram of the frequency deviation relative to ambient temperature of a surface acoustic wave oscillator according to another embodiment of the invention which comprises three parallel-connected surface acoustic wave resonators.

A solid line curve $Q_0$ of FIG. 7 indicates the frequency deviation relative to ambient temperature of a surface acoustic wave oscillator which comprises three parallel-connected resonators $M_1$, $M_2$, $M_3$.

The curves $Q_1$, $Q_2$, $Q_3$ of FIG. 7 denote the temperature characteristic curves of the frequencies of the respective resonators $M_1$, $M_2$, $M_3$ when connected to an active element-containing circuit. The temperature characteristic curve $Q_0$ of the resonator frequency is more prominently improved than the temperature characteristic curves $Q_1$, $Q_2$, $Q_3$ of the frequencies of the resonators $M_1$, $M_2$, $M_3$ each comprising a single resistor. Therefore, the three parallel-connected surface acoustic wave resonators $M_1$, $M_2$, $M_3$ are regarded to meet the condition of $f_3 - f_1 \leq \Delta fa$ derived from the formula (3) and the condition of $T_{p1} < T_{p2} < T_{p3}$ resulting from the formula (4).

There will now be described the concrete arrangement and construction of a plurality of surface acoustic wave resonators capable of satisfying the conditions expressed by the aforesaid formulas (3), (4).

Figure 8:
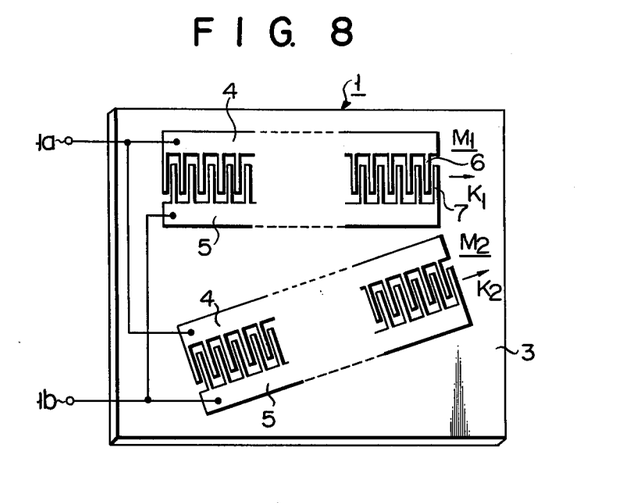
FIG. 8 schematically indicates the arrangement of two surface acoustic wave resonators according to another embodiment of the invention which are so arranged as to cause the respective surface acoustic waves to be propagated in different directions.

Referring to the embodiment of FIG. 8, the surface acoustic waves delivered from the surface acoustic wave resonators $M_1$, $M_2$ are propagated in different directions as indicated by the arrows $K_1$, $K_2$, and at different rates of temperature dependence. Due to the propagating in the respective directions $K_1$, $K_2$, the surface acoustic waves are designed to intersect each other at a prescribed angle, and the impedances $Z_1$, $Z_2$ of the surface acoustic wave resonators $M_1$, $M_2$ are now rendered subject to temperature dependence. Since, as the result, the frequencies $f_1$, $f_2$ of the surface acoustic wave resonators $M_1$, $M_2$ and in consequence the turnover temperatures thereof vary with the impedances $Z_1$, $Z_2$, the surface acoustic wave oscillator of the embodiment of FIG. 8 can satisfy the conditions of the formulas (3), (4). Eventually, therefore, the frequency of the surface acoustic wave oscillator of FIG. 8 is little affected by ambient temperature over a broad range.

Figure 9:
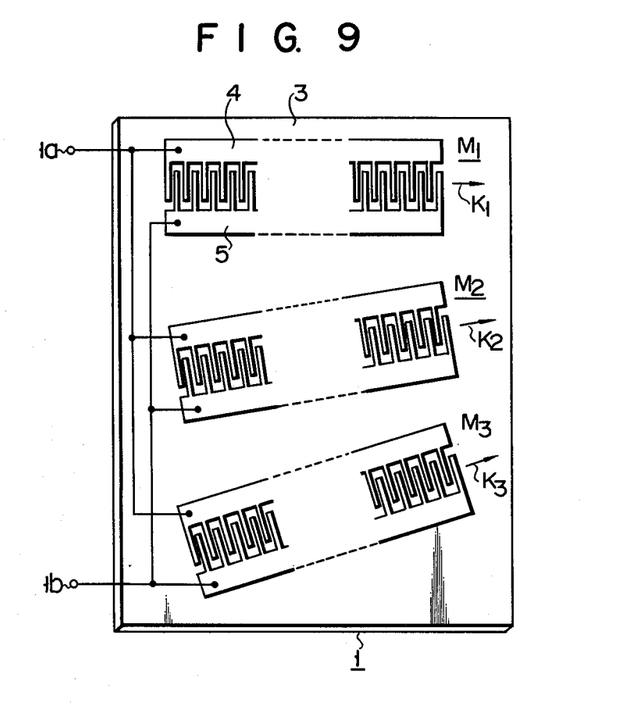
FIG. 9 schematically shows the arrangement of three surface acoustic wave resonators according to still another embodiment of the invention which are so arranged as to cause the respective surface acoustic waves to be propagated in different directions.

FIG. 9 illustrates the arrangement of a surface acoustic wave oscillator comprising three surface acoustic wave resonators $M_1$, $M_2$, $M_3$. Surface acoustic waves are propagated from said oscillator in different directions, thereby attaining the same result as the embodiment of FIG. 8.

Figure 10:
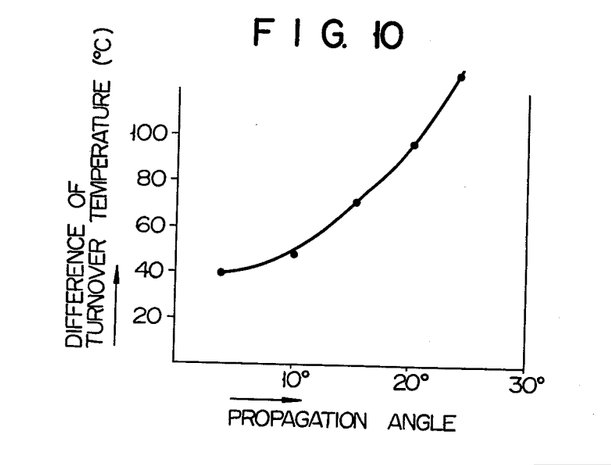
FIG. 10 graphically denotes relationship between propagation angles defined by different propagating direction of surface acoustic means accurring in the embodiment of FIG. 8 and different turnover temperatures on the curves showing frequency directions relative to ambient temperature.

FIG. 10 sets forth a curve plotted from experiments conducted with the embodiments of FIGS. 8 and 9. The curve shows the extent to which turnover temperture varies with an angle defined by the propagation direction of surface acoustic waves indicated by, for example, the arrows $K_1$, $K_2$.

Figure 11:
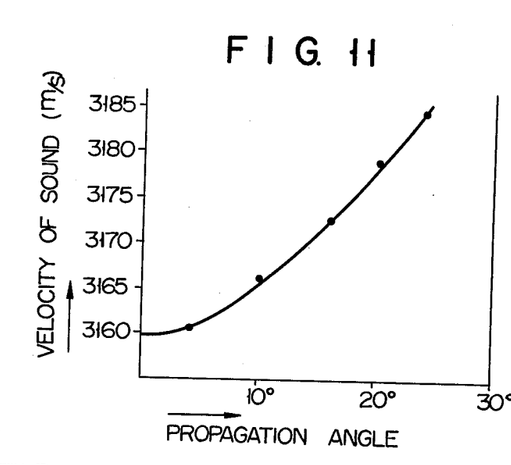
FIG. 11 graphically shows relationship between the angles defined by surface acoustic waves propagating in different directions over the surface of the resonators according to the embodiment of FIG. 8 and variations in the propagating velocity of said surface acoustic wave.

FIG. 11 shows a curve plotted from experiments carried out with the embodiments of FIGS. 8 and 9. The curve indicates the extent to which the propagation velocity of a surface acoustic wave varies with an angle defined by the directions of said propagation. As is apparent from FIG. 10 or FIG. 11, the more broadened the angle defined by the propagation directions of a surface acoustic wave, the higher the turnover temperature and the propagation velocity. Namely, where a plurality of surface acoustic wave resonators are so arranged as to cause a surface wave to be propagated over the surface of said resonators in different directions, then the conditions denoted by the formulas (3), (4) can be satisfied.

Figure 12:
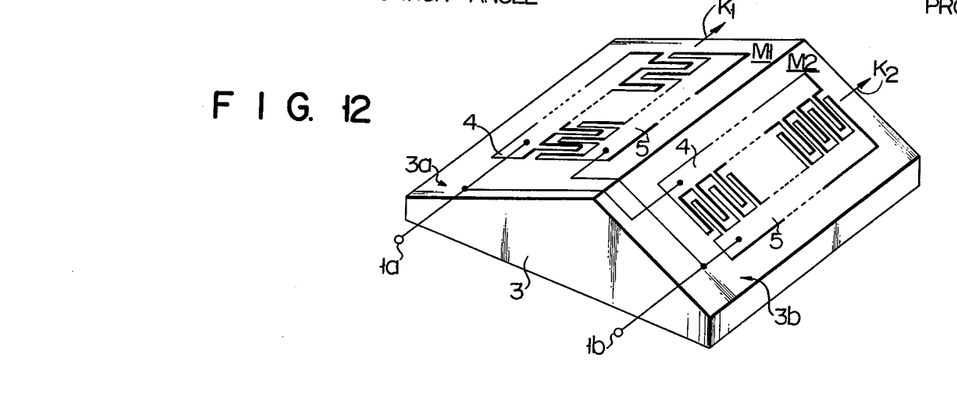
FIG. 12 is an oblique view of a surface acoustic wave oscillator according to still another embodiment of the invention, in which surface acoustic wave resonators are arranged on the different main rotated Y cut planes of the quartz substrate.
Figure 13:
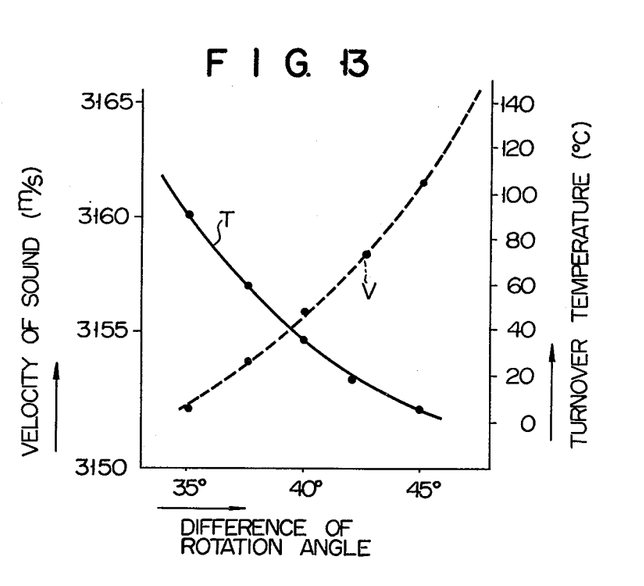
FIG. 13 graphically represents relationship between the turnover temperatures corresponding to the different rotation angles of the respective rotated Y cut planes of the quartz substrate and the propagation velocity of surface acoustic waves.

There will now be described by reference to FIG. 12 a surface acoustic wave oscillator according to still another embodiment of this invention. The quartz substrate 3 has two main planes 3a, 3b formed of different rotated Y cut planes. A surface acoustic wave is propagated in the same direction as indicated by the arrows $K_1$, $K_2$ over said two main planes 3a, 3b. Where, as in the embodiment of FIG. 12, the main planes 3a, 3b of the quartz substrate 3 did not lie on the same horizontal plane but were so inclined as to indicate a certain rotation angle difference relative to a referential plane, experiments were made to determine the extent to which the turnover temperature and surface wave propagation velocity of the resonators $M_1$, $M_2$ varied, the results being set forth in the curve diagram of FIG. 13. In FIG. 13, line T corresponds to turnover temperature and line V corresponds to velocity. The broader the rotation angle difference between the two main planes 3a, 3b, the lower the turnover temperature, and conversely the higher the propagation velocity of a surface acoustic wave. The above-mentioned rotation angle difference of the main planes 3a, 3b positively causes the frequency of both surface acoustic wave resonators $M_1$, $M_2$ to be more affected by ambient temperature. Eventually, therefore, the surface acoustic wave oscillator of FIG. 12 comprising a plurality of parallel-connected resonators can meet the conditions expressed by the aforesaid formulas (3), (4).

Figure 14:
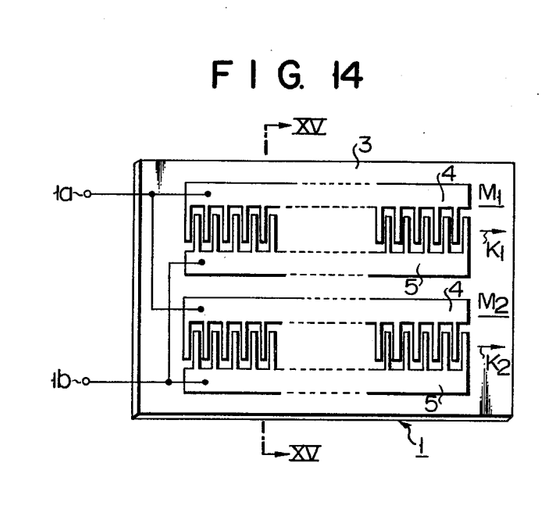
FIG. 14 schematically shows the arrangement of two parallel connected surface acoustic wave resonators according to a further embodiment of the invention, in which the interdigitated electrodes of one of the resonators have a different thickness from those of the other.
Figure 15:
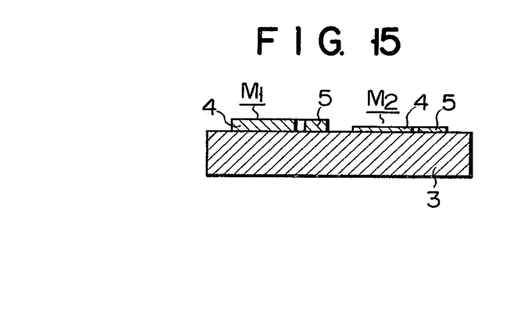
FIG. 15 is a cross sectional view on line XV—XV of FIG. 14.

There will now be described by reference to FIGS. 14 and 15 a surface acoustic wave oscillator according to a further embodiment of this invention. Two surface acoustic wave resonators $M_1$, $M_2$ are mounted on the same main plane formed of the ST cut plane of the quartz substrate 3. As in the embodiment of FIG. 12, a surface acoustic wave is propagated over the surface of said resonators $M_1$, $M_2$ in the same direction as indicated by the arrows $K_1$, $K_2$. With the embodiment of FIGS. 14 and 15, however, the electrodes 4, 5 of one (for example, $M_1$) of said two resonators have a different thickness from the electrodes 4, 5 of the other resonator ($M_2$). Experiments were conducted to find variations in the turnover temperature and surface acoustic wave propagation velocity of said resonators $M_1$, $M_2$, the results being set forth in the curve diagram of FIG. 16. In this figure broken line T corresponds to turnover temperature and line V corresponds to velocity. In the above-mentioned experiments, the electrodes were prepared from aluminium. As seen from FIG. 16, the larger the difference between the thicknesses of both aluminium electrodes, the lower the turnover temperature and surface acoustic wave propagation velocity of the two resonators $M_1$, $M_2$. Therefore, a surface acoustic wave resonator according to the embodiment of FIGS. 14 and 15 can also meet the conditions represented by the aforesaid formulas (3), (4).

Figure 16:
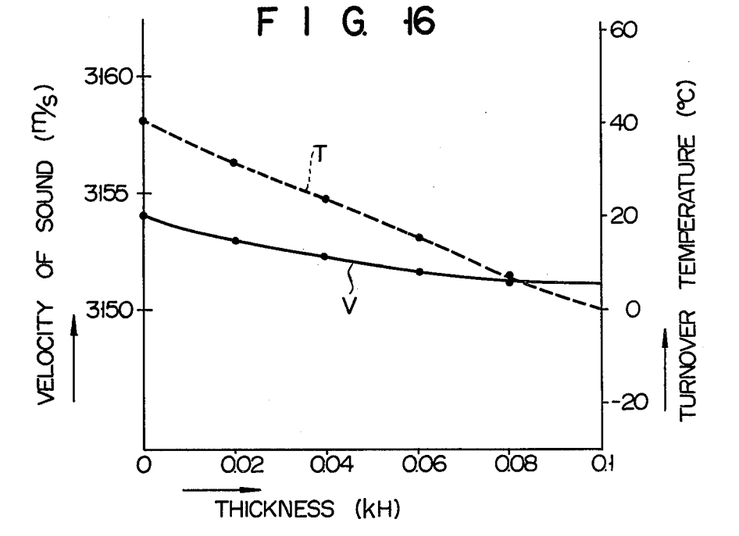
FIG. 16 graphically indicates relationship between the turnover temperatures corresponding to the different thickness of the aluminum electrodes of the embodiment of FIG. 14 and the propagation velocity of surface acoustic waves.
Figure 17:
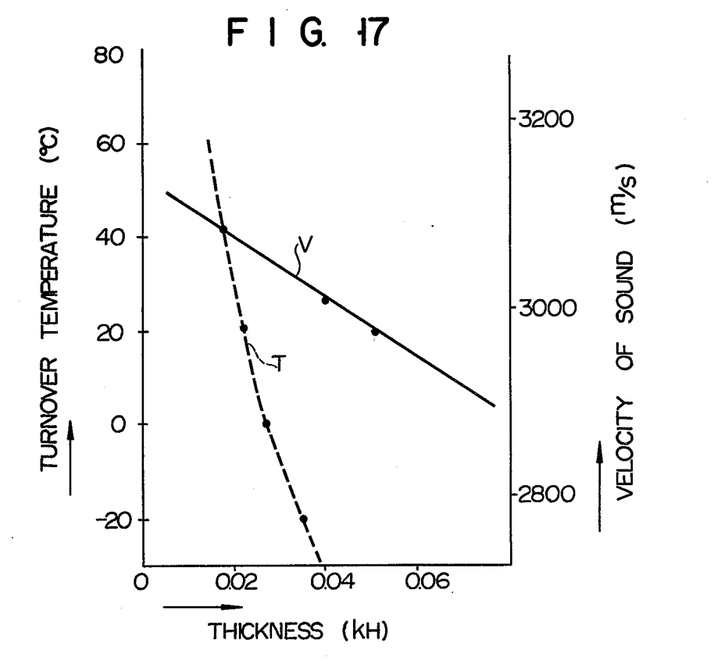
FIG. 17 graphically shows relationship between the turnover temperatures corresponding to the different thicknesses of the gold electrodes of the embodiment of FIG. 14 and the propagation velocity of surface acoustic waves.

FIG. 16 relates to the case where the two electrodes 4, 5 are made of aluminum. FIG. 17 relates to the case where two electrodes 4, 5 are made of gold. In FIGS. 16 and 17, line T corresponds turnover temperature and line V corresponds to velocity. Where, however, both electrodes 4, 5 are prepared from gold, then, as shown in FIG. 17, the turnover temperature and surface acoustic wave propagation velocity more prominently vary than in the case of aluminium electrodes, even when the gold electrodes have the same thickness difference as the aluminium electrodes. As mentioned above, where the two surface acoustic wave resonators $M_1$, $M_2$ are connected in parallel, the temperature dependence of the frequency of said respective resonators $M_1$, $M_2$ can be made to vary with the electrode material thereof.

Figure 18:
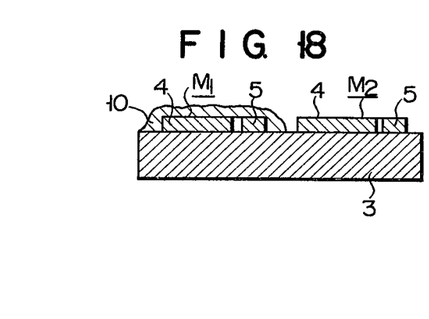
FIG. 18 is a cross sectional view of the resonator section of a surface acoustic wave oscillator according to another embodiment in which the frequencies of the adjacent resonators are designed to have different degrees of temperature dependence.
Figure 19:
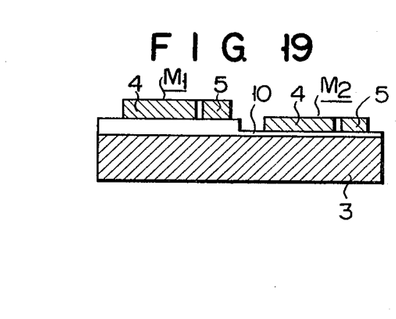
FIG. 19 is a cross sectional view of the resonator section of a surface acoustic wave oscillator according to still another embodiment in which the frequencies of the adjacent resonators are designed to have different degrees of temperature dependence.

The process of causing the frequencies of two adjacent resonators, for example, $M_1$, $M_2$ to have different degrees of temperature dependence can be effected either by depositing, as shown in FIG. 18, on the surface of the resonator $M_1$ a thin insulating layer 10 having a different temperature coefficient from the substrate 3, or by providing said thin insulating layer 10, as shown in FIG. 19, between the substrate 3 on one hand and the interdigital electrodes 4, 5 on the other. Said thin insulating layer 10 should advisably be formed of aluminium oxide ($Al_2O_3$) or magnesium fluoride ($MgF_2$) which admits of easy production. Where particularly in the case of a thin insulating layer of magnesium fluoride, kH (kH being the relative film thickness which is normalized according to wavelength) is set at 0.03 (with the resonator frequency taken to be 300 MHz and the thickness of said insulating layer to be 50 nm), then a turnover temperature can be reduced to about 80° C. which appears on a temperature dependence characteristic curve of the frequencies of SAW oscillators each comprising a plurality of or single resonator. It is experimentally proved that the turnover temperature can be varied aproximately in proportion to the thickness of said thin insulating layer of magnesium fluoride. This means that the conditions expressed by the previously shown formulas (3), (4) can be satisfied also by forming the above-mentioned thin insulating layer, namely, the resonance arrangements of FIGS. 18 and 19 enable the respective resonators to have different degrees of temperature dependence from each other. The conditions of the formulas (3), (4) can obviously be satisfied by combinations of the aforesaid processes of changing the propagating directions of a surface acoustic wave, the main plane of, for example, a quartz substrate and the raw materials of interdigital electrodes. The parts of the embodiments of FIGS. 18 and 19 the same as those of FIG. 15 are denoted by the same numerals, description thereof being omitted.

The foregoing embodiments refer to the case where the parallel-connected surface acoustic wave resonators comprised a pair of interdigitated electrodes respectively. However, this invention is not restrictively applied to such case, but may be used with a cavity type resonator clamped between a pair of reflection latices.

With a surface acoustic wave oscillator of the invention, a resonator circuit formed of a plurality of parallel-connected surface acoustic wave resonators is connected to an active element-containing circuit. The resonators are so constructed as to indicate different turnover temperatures and surface acoustic wave propagation velocities. If the different oscillation frequencies and turnover temperatures are so related to each other as to satisfy the prescribed conditions, then it is possible to provide a surface acoustic wave oscillator whose frequency is little affected by ambient temperature over a broad range.

What we claim is:

1. A surface acoustic wave oscillator which comprises a resonator circuit formed of a plurality of parallel-connected surface acoustic wave resonators indicating turnover temperatures on different curves denoting frequency deviations relative to ambient temperature, each said surface acoustic wave resonator being formed of a pair of interdigital electrodes which are mounted on a substrate for propagating a surface acoustic wave, and whose electrode elements are arranged alternately adjacent to each other; and an active element-containing circuit connected to the resonator circuit, wherein the plurality of surface acoustic wave resonators are so constructed that the relationship between the different frequencies of said resonators and the frequency deviations thereof and the relationship between the different turnover temperatures satisfy the following formulas:

$$f_H - f_L \leq \Delta f_a$$

$$T_{p1} < \ldots < T_{pn}$$

where $f_H$: a maximum frequency among those frequencies of a plurality of resonators collectively connected to the active element-containing circuit which are produced at turnover temperatures on a temperature curve;

$f_L$: a minimum frequency among those of said plurality of resonators;

$\Delta f_a$: allowable frequency deviation of the surface acoustic wave oscillator;

$T_{p1}$ to $T_{pn}$: turnover temperatures corresponding to the respective surface acoustic wave resonators.

2. The surface acoustic wave oscillator according to claim 1, wherein the substrate is formed of a quartz material having a rotated Y cut main plane; and the resonators are parallel to each other on said main plane, a surface acoustic wave being propagated in different directions over the main plane of the quartz substrate of the respective surface acoustic wave resonators.

3. The surface acoustic wave oscillator according to claim 1, wherein the substrate is formed of a quartz material having a rotated Y cut plane and two rotated Y cut main planes having different rotation cut angles and being inclined toward each other; and two surface acoustic wave resonators are mounted respectively on said two main planes of the quartz substrate and are so arranged on said main planes as to cause a surface acoustic wave to be propagated through the respective resonators in the same direction.

4. The surface acoustic wave oscillator according to any one of claims 1-3, wherein said pairs of interdigital electrodes constituting the respective surface acoustic wave resonators are formed with different thicknesses on the substrate.

5. The surface acoustic wave oscillator according to any one of claims 1-3, wherein a pair of interdigital electrodes constituting one surface acoustic wave resonator is made of a different material from that of another surface acoustic wave resonator.

6. The surface acoustic wave oscillator according to claim 5, wherein said different electrode materials are aluminum and gold.

7. The surface acoustic wave oscillator according to claim 1, wherein an insulating layer overlies at least one of said pairs of interdigital electrodes.

8. The surface acoustic wave oscillator according to claim 1 wherein an insulating layer is provided between said resonators and said substrate.

9. The surface acoustic wave oscillator according to claim 7 or 8 wherein said insulating layer is formed of magnesium fluoride.

10. The surface acoustic wave oscillator according to claim 7 or 8 wherein said insulating layer is prepared from aluminum oxide.

* * * * *